United States Patent
Lin

(10) Patent No.: US 12,500,165 B2
(45) Date of Patent: Dec. 16, 2025

(54) SEMICONDUCTOR STRUCTURE AND METHOD OF FORMING THE SAME

(71) Applicant: NANYA TECHNOLOGY CORPORATION, New Taipei (TW)

(72) Inventor: Li Han Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 435 days.

(21) Appl. No.: 18/171,678

(22) Filed: Feb. 21, 2023

(65) Prior Publication Data

US 2024/0282700 A1    Aug. 22, 2024

(51) Int. Cl.
| H01L 23/528 | (2006.01) |
| H01L 21/02 | (2006.01) |
| H01L 21/311 | (2006.01) |
| H01L 21/768 | (2006.01) |

(52) U.S. Cl.
CPC ...... *H01L 23/528* (2013.01); *H01L 21/02164* (2013.01); *H01L 21/0217* (2013.01); *H01L 21/02252* (2013.01); *H01L 21/31111* (2013.01); *H01L 21/31144* (2013.01); *H01L 21/76826* (2013.01); *H01L 21/76885* (2013.01)

(58) Field of Classification Search
CPC ............. H01L 23/528; H01L 21/02164; H01L 21/0217; H01L 21/02252; H01L 21/31111; H01L 21/31144; H01L 21/76826; H01L 21/76885
See application file for complete search history.

(56) References Cited

U.S. PATENT DOCUMENTS

| 2008/0179668 A1* | 7/2008 | Tai ..................... H10D 30/0297 257/E21.409 |
| 2018/0240705 A1* | 8/2018 | Chang ................. H10B 12/485 |
| 2020/0203272 A1* | 6/2020 | Doebler ............. H01L 23/5226 |
| 2022/0359225 A1* | 11/2022 | More ................. H10D 84/0151 |
| 2023/0420529 A1* | 12/2023 | Liao ..................... H10D 30/0295 |

OTHER PUBLICATIONS ip.com search done. (Year: 2025).*
Espace.net search done. (Year: 2025).*

* cited by examiner

*Primary Examiner* — Zandra V Smith
*Assistant Examiner* — Andre C Stevenson
(74) *Attorney, Agent, or Firm* — CKC & Partners Co., LLC

(57) ABSTRACT

A method of forming a semiconductor structure includes forming a conductive structure in a first dielectric layer. A second dielectric layer is formed over the first dielectric layer. A conductive contact is formed in the second dielectric layer. The second dielectric layer is etched to form a recess on a top surface of the conductive structure. A native oxide layer is formed on a top surface and a sidewall of the second dielectric layer, the top surface of the conductive structure, and a sidewall of the conductive contact. A first plasma process is performed to form a first material layer over the native oxide layer by using a first plasma gas. A second plasma process is performed to form a second material layer over the first material layer by a second plasma gas different from the first plasma gas. A spacer layer is formed on the second material layer.

11 Claims, 7 Drawing Sheets

SEMICONDUCTOR STRUCTURE AND METHOD OF FORMING THE SAME

BACKGROUND

Technical Field

The present disclosure relates to a method of forming a semiconductor structure and a semiconductor structure.

Description of Related Art

In the process of manufacturing or processing a semiconductor structure, repeatedly performing multiple deposition and etching steps may be included. During performing the deposition and etching steps, the interaction between the deposition and etching steps may affect the performance of manufactured electronic devices. If the manufacturing bottleneck encountered in the process can be solved (e.g., by modifying the process steps), the performance of the manufactured electronic devices can be effectively improved.

Therefore, how to propose a method of forming a semiconductor structure that can solve the above-mentioned problems is particularly important in the industry.

SUMMARY

One aspect of the present disclosure is a method of forming a semiconductor structure.

According to some embodiments of the present disclosure, a method of forming a semiconductor structure includes forming a conductive structure in a first dielectric layer. A second dielectric layer is formed over the first dielectric layer. A conductive contact is formed in the second dielectric layer. The second dielectric layer is etched to form a recess on a top surface of the conductive structure. A native oxide layer is formed on a top surface and a sidewall of the second dielectric layer, the top surface of the conductive structure, and a sidewall of the conductive contact. A first plasma process is performed to form a first material layer over the native oxide layer by using a first plasma gas. A second plasma process is performed to form a second material layer over the first material layer by using a second plasma gas different from the first plasma gas. A spacer layer is formed on the second material layer.

In some embodiments, forming the spacer layer is performed such that the second material layer is between the spacer layer and the first material layer.

In some embodiments, the first plasma gas of the first plasma process includes a non-oxygen containing gas, and the second plasma gas of the second plasma process includes oxygen.

In some embodiments, a process time of the first plasma process is greater than a process time of the second plasma process.

In some embodiments, forming the spacer layer is performed such that a thickness of the spacer layer is greater than a thickness of the second material layer.

In some embodiments, the method of forming the semiconductor structure further includes forming a patterned mask over the conductive contact, wherein etching the second dielectric layer is performed by using the patterned mask as an etch mask to form the recess.

In some embodiments, forming the spacer layer is performed such that the spacer layer has a sidewall along a sidewall of the patterned mask.

In some embodiments, forming the spacer layer is performed such that the sidewall of the spacer layer is in contact with a top surface of the spacer layer on the second dielectric layer.

In some embodiments, the method of forming the semiconductor structure further includes performing an etching process to partially remove the spacer layer.

In some embodiments, the etching process is performed such that the spacer layer in the recess is remained and the second material layer is exposed.

In some embodiments, the etching process is performed using an acid etchant.

Another aspect of the present disclosure is a semiconductor structure.

According to some embodiments of the present disclosure, a semiconductor structure includes a substrate, a first dielectric layer, a conductive structure, a second dielectric layer, a conductive contact, a native oxide layer, a first material layer, a second material layer, and a spacer. A first dielectric layer is located over the substrate. A conductive structure is located in the first dielectric layer. A second dielectric layer is located over the first dielectric layer. A conductive contact is located in the second dielectric layer, in which a recess is between the conductive contact and the second dielectric layer. The native oxide layer is located over a top surface and a sidewall of the second dielectric layer, a top surface of the conductive structure, and a sidewall of the conductive contact. The first material layer is located over the native oxide layer and in the recess. The second material layer is located over the first material layer and in the recess, in which the second material layer includes a material different from a material of the first material layer. The spacer is filled in the recess.

In some embodiments, the spacer is separated from the first material layer by the second material layer.

In some embodiments, forming the second material layer is in contact with the first material layer.

In some embodiments, the spacer is in contact with the second material layer.

In some embodiments, the first material layer is a nitride layer and the second material layer is an oxide layer.

In some embodiments, the material of the second material layer is different from a material of the spacer layer.

In some embodiments, the native oxide layer has a first portion in contact with the conductive contact and a second portion in contact with the second dielectric layer, and the first portion of the native oxide layer includes a material different from a material of the second portion of the native oxide layer.

In some embodiments, the first material layer has a first portion in contact with the first portion of the native oxide layer and a second portion in contact with the second portion of the native oxide layer, and the first portion of the first material layer includes a material different from a material of the second portion of the first material layer.

In some embodiments, the second material layer has a first portion in contact with the first portion of the first material layer and a second portion in contact with the second portion of the first material layer, and the first portion of the second material layer includes a material different from that of the second portion of the second material layer.

In the aforementioned embodiments, since the second plasma process is performed after the first plasma process, an adhesion between the spacer layer and the second material layer may be improved. As such, the spacer layer may become thicker and thus the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
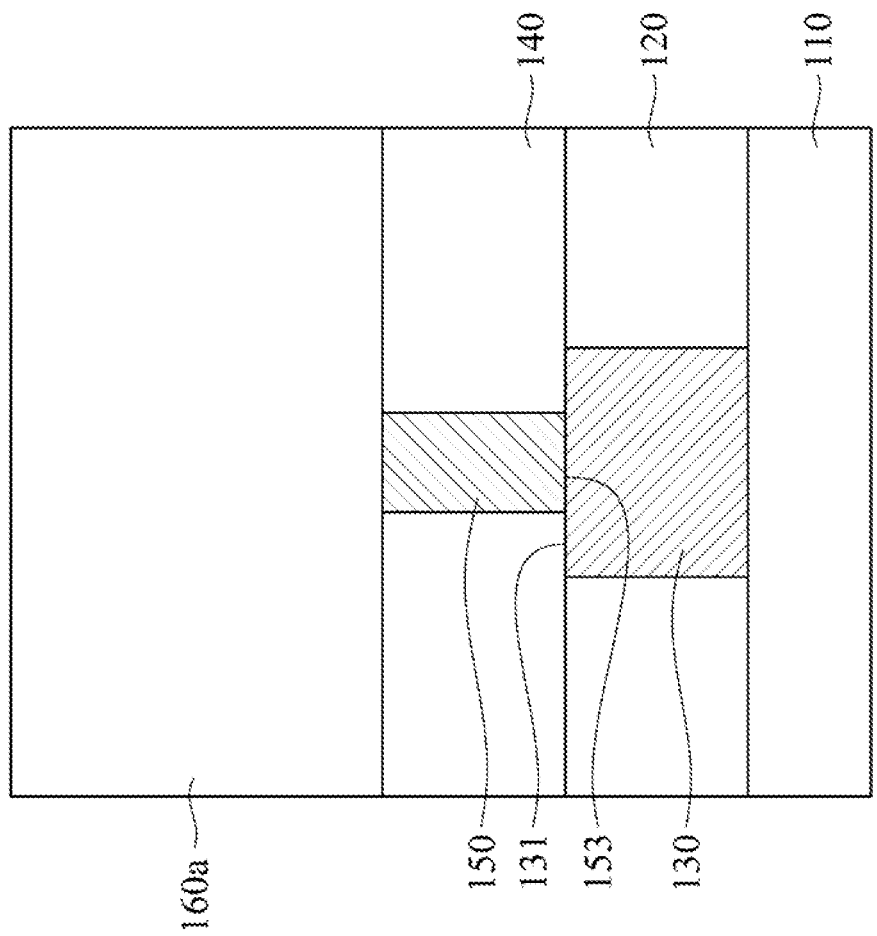
FIGS. 1-7 illustrate cross-section views of intermediate stages of a process of a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-7 illustrate cross-section views of intermediate stages of a process of a semiconductor structure in accordance with some embodiments of the present disclosure. Referring to FIG. 1, a first dielectric layer 120 is formed over a substrate 110. In some embodiments, the substrate 110 includes silicon. In some other embodiments, the substrate 110 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The first dielectric layer 120 may be formed by chemical vapor deposition (CVD), atomic layer deposition (ALD), physical vapor deposition (PVD), or other suitable process. In some embodiments, the first dielectric layer 120 includes silicon oxide, or other suitable materials.

After the first dielectric layer 120 is formed over the substrate 110, the conductive structure 130 is formed in the first dielectric layer 120. In some embodiments, the method of forming the conductive structure 130 includes etching the first dielectric layer 120 to form an opening exposing the substrate 110, and then filling conductive materials into the opening to form the conductive structure 130. The conductive structure 130 may include a semiconductor material (e.g., polysilicon), or other suitable materials.

Thereafter, the second dielectric layer 140 is formed over the first dielectric layer 120. The second dielectric layer 140 may be formed by CVD, ALD, PVD, or other suitable process. In some embodiments, the second dielectric layer 140 and the first dielectric layer 120 include different material. For example, the second dielectric layer 140 includes silicon nitride and the first dielectric layer 120 includes silicon oxide.

After the second dielectric layer 140 is formed over the first dielectric layer 120, the conductive contact 150 is formed in the second dielectric layer 140. In some embodiments, the method of forming the conductive contact 150 includes etching the second dielectric layer 140 to form an opening exposing the conductive structure 130, and then filling conductive materials into the opening to form the conductive contact 150. The conductive contact 150 may include a metal material (e.g., tungsten), or other suitable materials. In some embodiments, the conductive contact 150 is referred as a bit line contact that is electrically connected to a bit line (not shown) and the conductive structure 130. In some embodiments, the conductive contact 150 has a width smaller than that of the conductive structure 130. Specifically, a bottom surface 153 of the conductive contact 150 is in contact with a top surface 131 of the conductive structure 130, in which a portion of the top surface 131 of the conductive structure 130 is covered by the bottom surface 153 of the conductive contact 150 and the other portions of the top surface 131 of the conductive structure 130 is not covered by the bottom surface 153 of the conductive contact 150 (e.g., covered by the second dielectric layer 140).

After the conductive contact 150 is formed in the second dielectric layer 140, a mask layer 160a is formed over the second dielectric layer 140 and the conductive contact 150. The mask layer 160a may be formed by CVD, ALD, PVD, or other suitable process. In some embodiments, the mask layer 160a is formed from a dielectric material, such as silicon nitride. In some embodiments, the mask layer 160a and the second dielectric layer 140 include the same material (e.g., silicon nitride).

Figure 2:
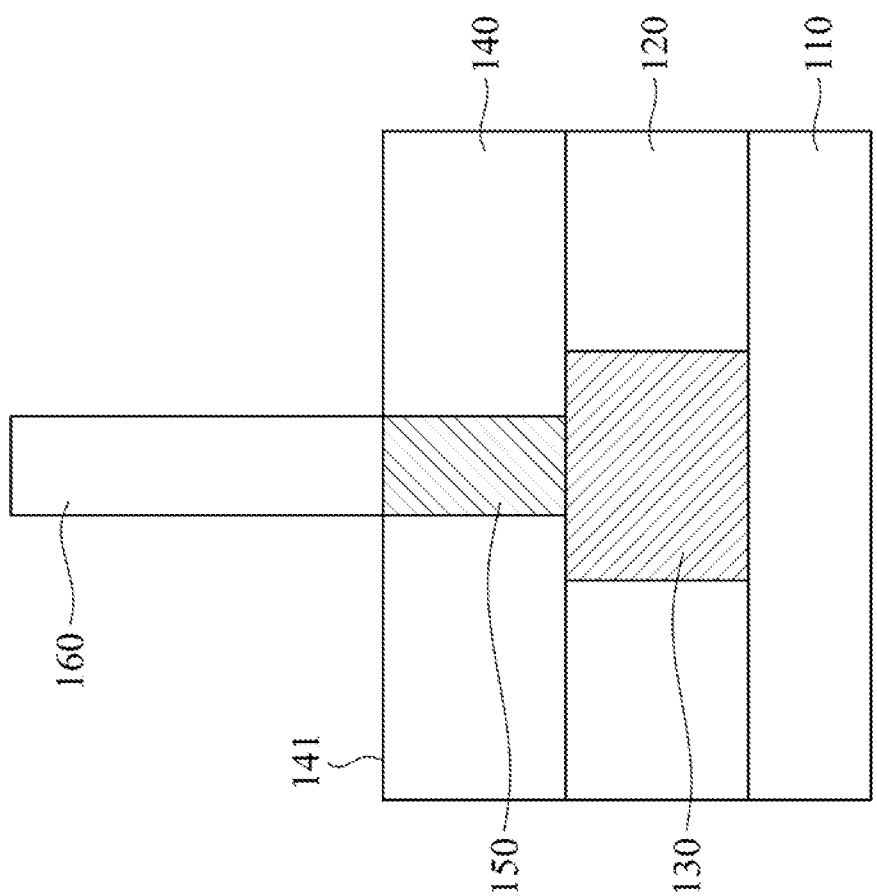

Referring to FIG. 1 and FIG. 2, the mask layer 160a is patterned into a patterned mask 160 to expose the second dielectric layer 140. In some embodiments, an entirety of a top surface 141 of the second dielectric layer 140 is exposed. In other words, the patterned mask 160 may have a width substantially the same as that of the conductive contact 150. In some embodiments, the mask layer 160a is patterned by performing an etching process, in which the etching process may be either dry or wet etching.

Figure 3:
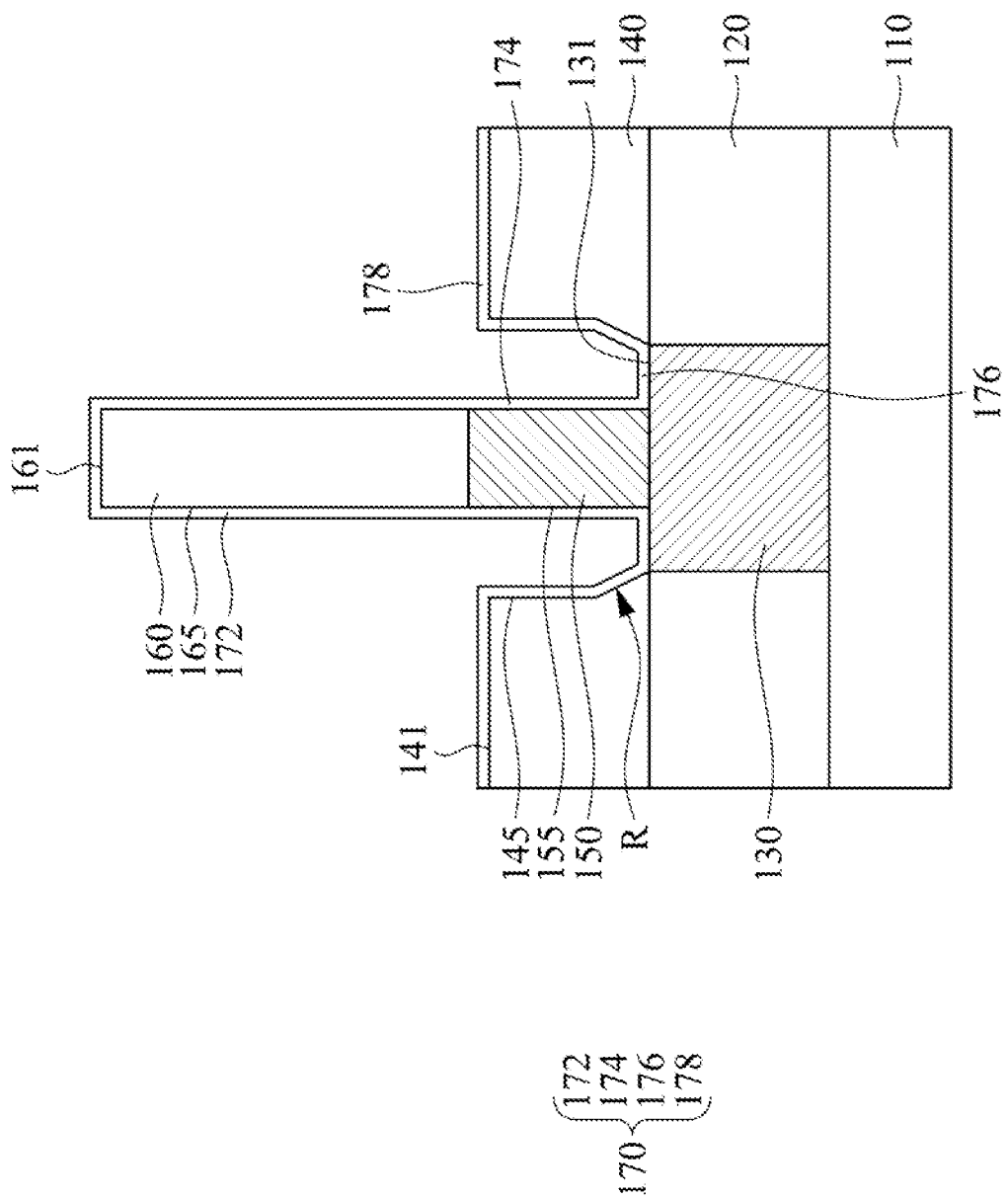

Referring to FIG. 3, the second dielectric layer 140 is etched by using the patterned mask 160 as an etch mask to form a recess R on the top surface 131 of the conductive structure 130. In greater details, the recess R exposes a top surface 141 and a sidewall 145 of the second dielectric layer, the top surface 131 of the conductive structure 130, a sidewall 155 of the conductive contact 150, and a top surface 161 and a sidewall 165 of the patterned mask 160. A native oxide layer 170 is then formed on and in contact with the top surface 141 and the sidewall 145 of the second dielectric layer, the top surface 131 of the conductive structure 130, the sidewall 155 of the conductive contact 150, and the top surface 161 and the sidewall 165 of the patterned mask 160. In other words, the native oxide layer 170 is formed on the exposed surfaces (i.e., the top surfaces 131, 141 and 161 and sidewalls 145, 155 and 165) when the conductive structure 130, the second dielectric layer 140, the conductive contact 150 and patterned mask 160 are exposed to air under ambient conditions. In some embodiments, the native oxide layer 170 has a first portion 172 in contact with the top surface 161 and the sidewall 165 of the patterned mask 160, a second portion 174 in contact with the sidewall 155 of the conductive contact 150, a third portion 176 in contact with the top surface 131 of the conductive structure 130, and a fourth portion 178 in contact with the top surface 141 and the sidewall 145 of the second dielectric layer 140. The second portion 174 may include a material different from a material of the first portion 172, a material of the third portion 176 and a material of the fourth portion 178. The fourth portion 178 may include the material same as the material of the first portion 172 and the material of the third portion 176. For example, the first portion 172 includes silicon oxide, the second portion 174 includes metal oxide (e.g., tungsten oxide), the third portion 176 includes silicon oxide, and the fourth portion 178 includes silicon oxide.

Figure 4:
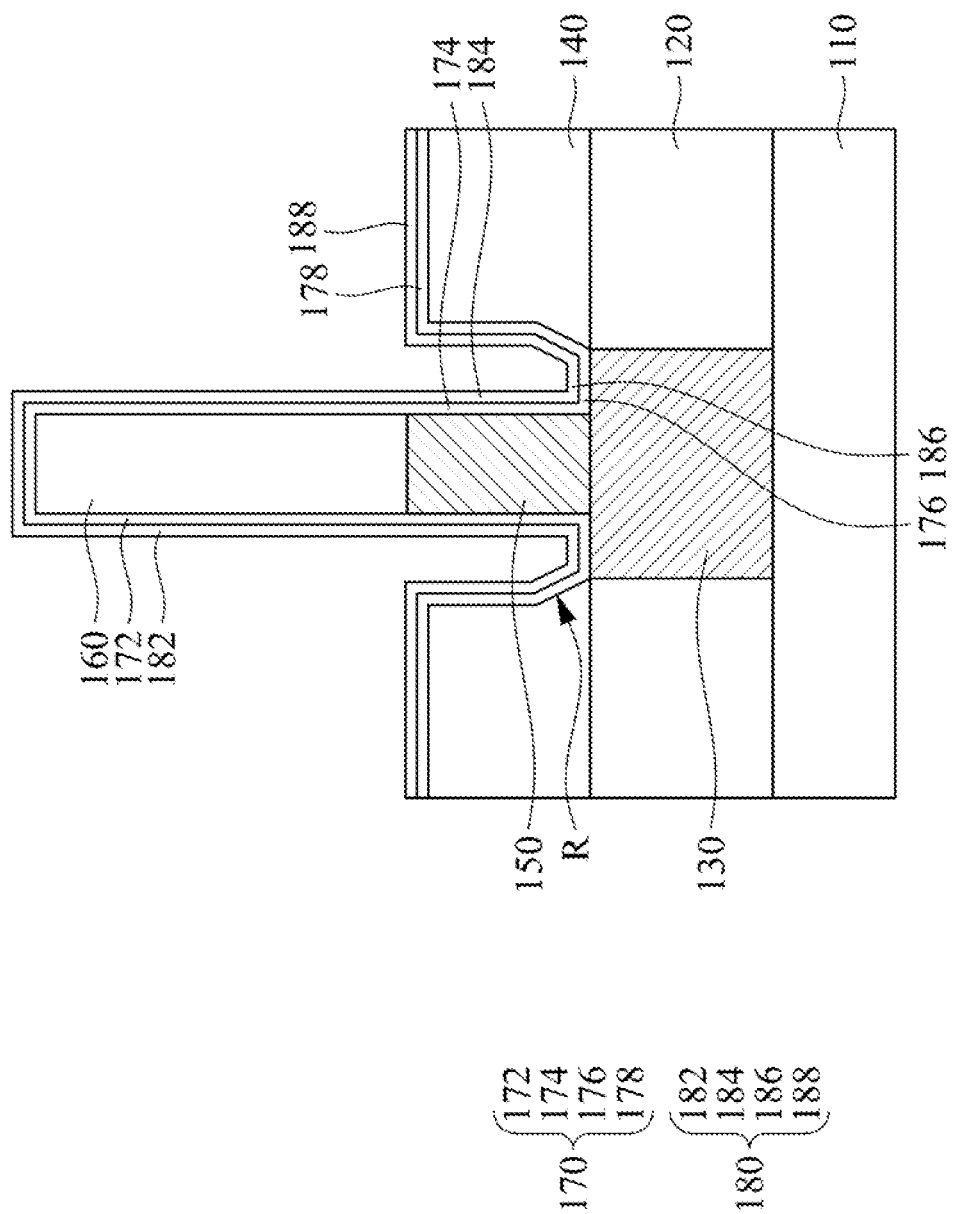

Referring to FIG. 4, a first plasma process is performed to form a first material layer 180 over the native oxide layer 170 by using a first plasma gas. In some embodiments, the first material layer 180 is formed conformally over the native oxide layer 170. Further, in the embodiment illustrated in FIG. 4, after the recess R is conformally covered with the native oxide layer 170 and the first material layer 180, the recess R is still not filled, and the first material layer 180 is only along a sidewall and a bottom surface of the recess R. In some embodiments, the first plasma process is a clean process, in which the clean process is performed to remove particles generated by the etching process of forming the recess R in FIG. 3. The electrical performance of the conductive contact 150 can be improved as a result of the first plasma process.

In some embodiments, the first plasma gas of the first plasma process is a non-oxygen containing plasma gas. For example, the first plasma gas includes nitrogen. In some embodiments, the first material layer 180 is a nitride layer. In some embodiments, a process time of the first plasma process is in a range of about 250 seconds to about 300 seconds.

In some embodiments, the first material layer 180 has a first portion 182 in contact with the first portion 172 of the native oxide layer 170, a second portion 184 in contact with the second portion 174 of the native oxide layer 170, a third portion 186 in contact with the third portion 176 of the native oxide layer 170, and a fourth portion 188 in contact with the of the fourth portion 178 of the native oxide layer 170. The second portion 184 of the first material layer 180 may include a material different from a material of the first portion 182, a material of the third portion 186 and a material of the fourth portion 188. The fourth portion 188 may include the material same as the material of the first portion 182 and the material of the third portion 186. For example, the first portion 182 includes silicon nitride, the second portion 184 includes metal nitride (e.g., tungsten nitride), the third portion 176 includes silicon nitride, and the fourth portion 178 includes silicon nitride.

Figure 5:
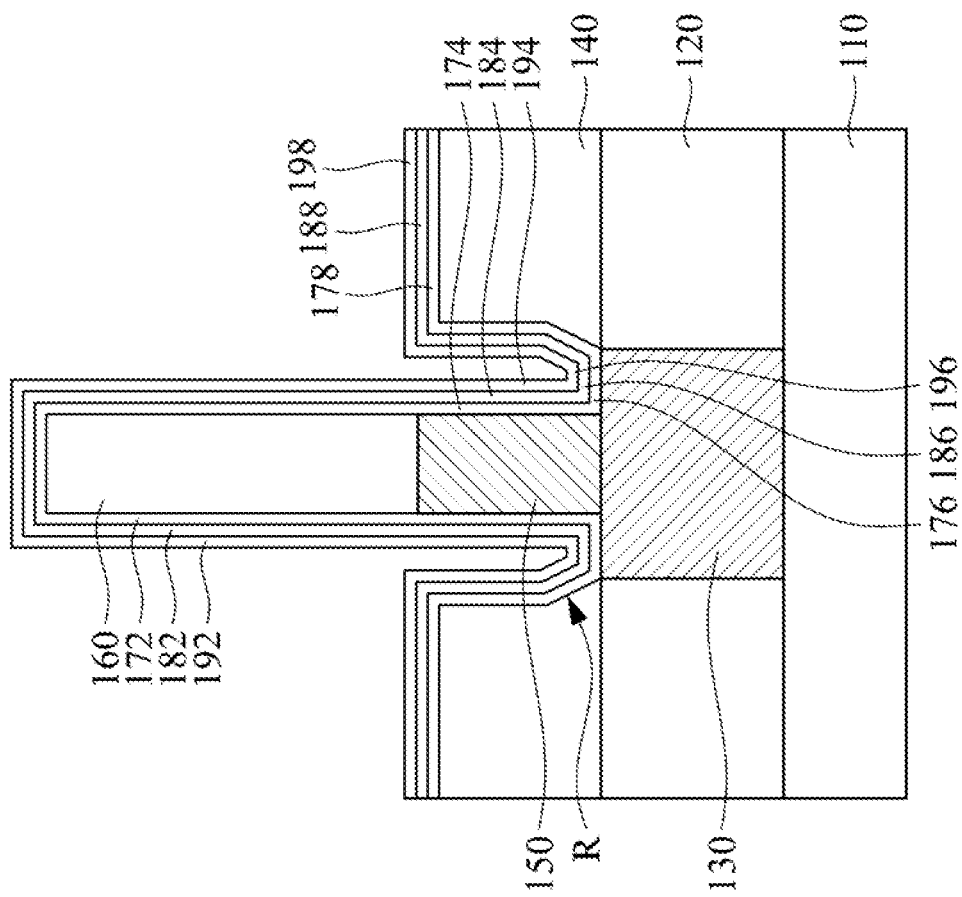

Referring to FIG. 5, after performing the first plasma process, a second plasma process is performed to form a second material layer 190 over the first material layer 180 by using a second plasma gas (e.g., oxygen containing plasma gas) different from the first plasma gas (e.g., non-oxygen containing plasma gas). In some embodiments, the second plasma gas of the second plasma process includes oxygen, and thus the second material layer 190 is an oxide layer. Since a surface of the second material layer 190 has oxygen, an adhesion between subsequently formed spacer layer 200a (see FIG. 6) and the second material layer 190 may be increased, and thus the spacer layer 200a (see FIG. 6) may become thicker.

In some embodiments, the second material layer 190 is formed conformally over the first material layer 180. The second material layer 190 is in contact with the first material layer 180. Further, in the embodiment illustrated in FIG. 5, after the recess R is conformally covered with the native oxide layer 170, the first material layer 180 and the second material layer 190, the recess R is still not filled, and the second material layer 190 is only along the sidewall and the bottom surface of the recess R.

In some embodiments, the first plasma process and the second process are ashing plasma processes. In some embodiments, the second plasma gas of the second plasma process includes a combination of oxygen, hydrogen and nitrogen, in which a ratio of oxygen to hydrogen and nitrogen may be in a range of about 5 to about 15 (e.g., 10). If the ratio of oxygen to hydrogen and nitrogen is less than about 5, the adhesion between subsequently formed spacer layer 200a (see FIG. 6) and the second material layer 190 may be not enough for forming thicker spacer layer 200a (see FIG. 6); if the ratio of oxygen to hydrogen and nitrogen is greater than about 15, the second material layer 190 may be too thick, thereby adversely affecting electrical performance of the conductive contact 150.

In some embodiments, the process time of the first plasma process is greater than a process time of the second plasma process. For example, the process time of the second plasma process is in a range of about 15 seconds to about 25 seconds. If the process time of the second plasma process is less than about 15, the adhesion between subsequently formed spacer layer 200a (see FIG. 6) and the second material layer 190 may be not enough for forming thicker spacer layer 200a (see FIG. 6); if the process time of the second plasma process is greater than about 25, the second material layer 190 may be too thick, thereby adversely affecting electrical performance of the conductive contact 150.

In some embodiments, the second material layer 190 includes a material different from a material of the first material layer 180. For example, the first material layer 180 is a nitride layer and the second material layer 190 is an oxide layer. In some embodiments, the second material layer 190 has a first portion 192 in contact with the first portion 182 of the first material layer 180, a second portion 194 in contact with the second portion 184 of the first material layer 180, a third portion 196 in contact with the third portion 186 of the of the first material layer 180, and a fourth portion 198 in contact with the fourth portion 188 of the first material layer 180. The second portion 194 of the second material layer 190 may include a material different from a material of the first portion 192, a material of the third portion 196 and a material of the fourth portion 198. The fourth portion 198 may include the material same as the material of the first portion 192 and the material of the third portion 196. For example, the first portion 192 includes silicon oxide, the second portion 184 includes metal oxide (e.g., tungsten oxide), the third portion 176 includes silicon oxide, and the fourth portion 178 includes silicon oxide.

Figure 6:
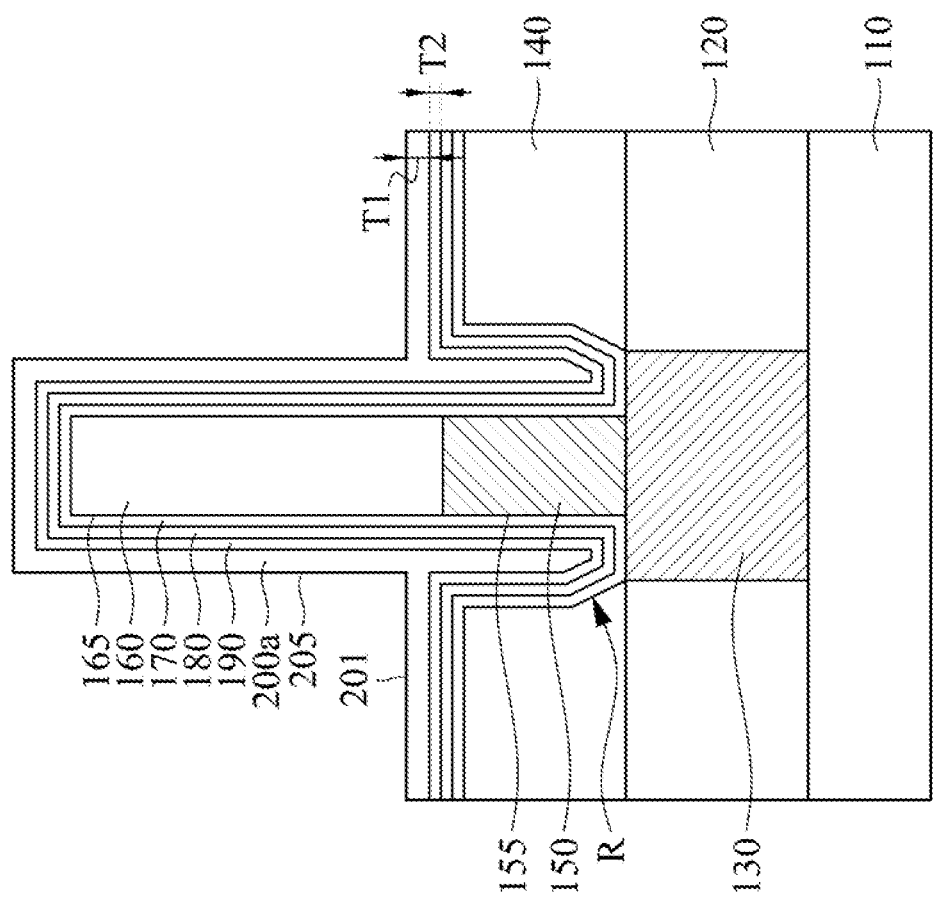

Referring to FIG. 6, after performing the second plasma process to form the second material layer 190, a second plasma process is performed to form a spacer layer 200a on the second material layer 190. The spacer layer 200a is in contact with the second material layer 190. In some embodiments, the spacer layer 200a is performed such that the second material layer 190 is between the spacer layer 200a and the first material layer 180. In some embodiments, the spacer layer 200a fills the recess. The spacer layer 200a has a sidewall 205 parallel with and along the sidewall 155 of the conductive contact 150 and the sidewall 165 of the patterned mask 160. The sidewall 205 of the spacer layer 200a is in contact with a top surface 201 of the spacer layer 200a directly on the second dielectric layer 140, in which the sidewall 205 connects and extends upward from the top surface 201.

In some embodiments, a thickness T1 of the spacer layer 200a is greater than a thickness T2 of the second material layer 190. For example, the thickness T1 of the spacer layer 200a is in a range of about 40 angstroms to about 60 angstroms (e.g., 45, 49, 50, or 55 angstroms), and the thickness T2 of the second material layer 190 is in a range of about 5 angstroms to about 10 angstroms (e.g., 6 or 7 angstroms). If the thickness T2 of the second material layer 190 is less than about 5 angstroms, the adhesion between the spacer layer 200a and the second material layer 190 may be not enough for forming thicker spacer layer 200a (e.g., the thickness T1 of the spacer layer 200a is less than 45 angstroms and thus cannot act as a dielectric spacer for the conductive contact 150); if the thickness T2 of the second material layer 190 is greater than about 10, the electrical performance of the conductive contact 150 may be adversely affected.

The spacer layer 200a may be formed by chemical vapor deposition (CVD), atomic layer deposition (ALD), physical vapor deposition (PVD), or other suitable process. In some embodiments, the material of the second material layer 190 is different from a material of the spacer layer 200a. In some embodiments, the material of the second portion 184 of the first material layer 180 is the same as the material of the spacer layer 200a. The spacer layer 200a may include silicon nitride, or other suitable materials.

Figure 7:
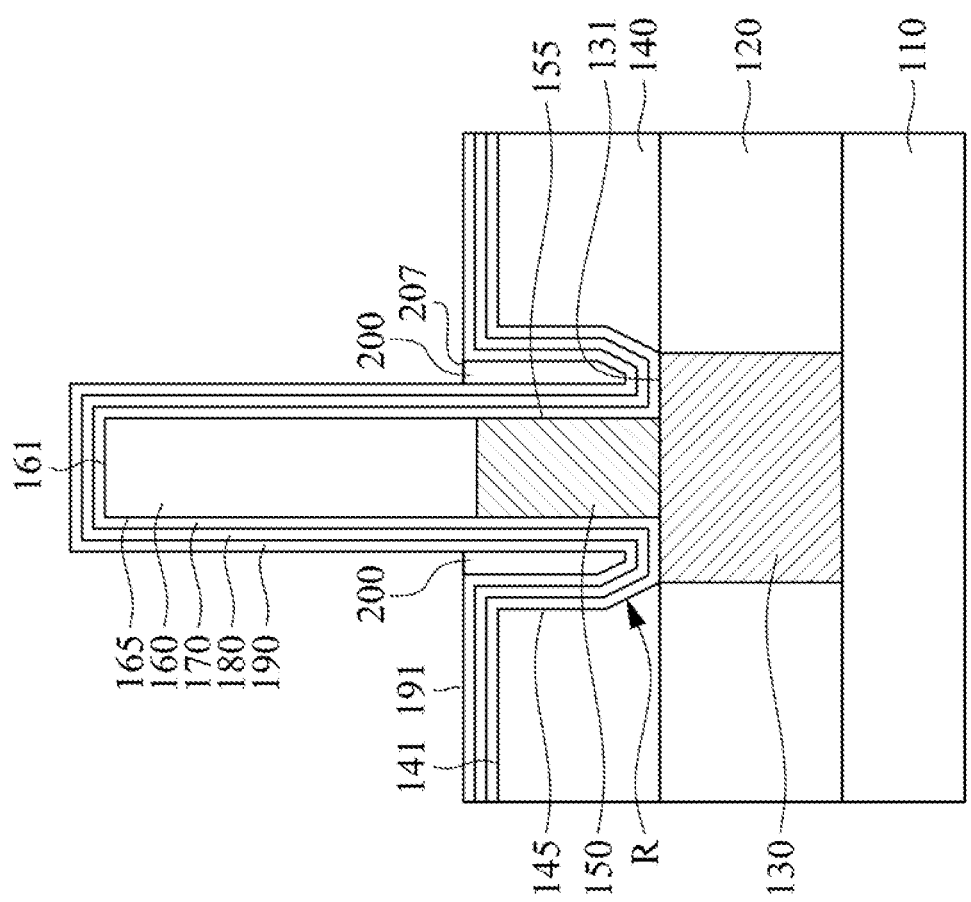

Referring to FIG. 7, after forming the spacer layer 200a, an etching process is performed to partially remove the spacer layer 200a. The spacer layer 200a outside the recess R is removed and the spacer layer 200a in the recess R is remained. In other words, the spacer layer 200a is partially removed to form a spacer 200 and the second material layer 190 is exposed. In some embodiments, a topmost surface 207 of the spacer 200 is substantially coplanar with a top surface 191 of the second material layer 190 directly on the second dielectric layer 140.

In some embodiments, the etching process of partially removing the spacer layer 200a is a wet etching process, and an etch solution thereof includes an acid etchant, such as phosphoric acid.

In some embodiments, a semiconductor structure includes the substrate 110, the first dielectric layer 120, the conductive structure 130, the second dielectric layer 140, the conductive contact 150, the patterned mask 160, the native oxide layer 170, the first material layer 180, the second material layer 190, and the spacer 200. The first dielectric layer 120 is located over the substrate 110. The conductive structure 130 is located in the first dielectric layer 120 and over the substrate 110. The second dielectric layer 140 is located over the first dielectric layer 120. The conductive contact 150 is located over and in contact with the conductive structure 130. The conductive contact 150 is located in the second dielectric layer 140, in which the recess R is between the conductive contact 150 and the second dielectric layer 140. The patterned mask 160 is located over and in contact with the conductive contact 150. The native oxide layer 170 is located on the top surface 141 and the sidewall 145 of the second dielectric layer, the top surface 131 of the conductive structure 130, the sidewall 155 of the conductive contact 150, and the top surface 161 and the sidewall 165 of the patterned mask 160. The first material layer 180 is conformally located over and in the recess R. The first material layer 180 is in contact with the native oxide layer 170. The second material layer 190 is conformally located over in the recess R, in which the second material layer 190 includes a material different from a material of the first material layer 180. The spacer 200 is filled in the recess R. In some embodiments, the spacer 200 is separated from the first material layer 180 by the second material layer 190. In some embodiments, the second material layer 190 is in contact with the first material layer 180, and the spacer 200 is in contact with the second material layer 190. In some embodiments, the first material layer 180 is a nitride layer, the second material layer 190 is an oxide layer, and the spacer is a nitride layer (e.g., silicon nitride).

The present disclosure provides a method of forming a semiconductor structure and a semiconductor structure. Since the second plasma process is performed after the first plasma process, the adhesion between the spacer layer and the second material layer may be improved. As such, the spacer layer may become thicker and thus the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    forming a conductive structure in a first dielectric layer;
    forming a second dielectric layer over the first dielectric layer;
    forming a conductive contact in the second dielectric layer;
    etching the second dielectric layer to form a recess on a top surface of the conductive structure;
    forming a native oxide layer is on a top surface and a sidewall of the second dielectric layer, the top surface of the conductive structure, and a sidewall of the conductive contact;
    performing a first plasma process to form a first material layer over the native oxide layer by using a first plasma gas;
    performing a second plasma process to form a second material layer over the first material layer by using a second plasma gas different from the first plasma gas; and
    forming a spacer layer on the second material layer.

2. The method of claim 1, wherein forming the spacer layer is performed such that the second material layer is between the spacer layer and the first material layer.

3. The method of claim 1, wherein the first plasma gas of the first plasma process comprises a non-oxygen containing gas, and the second plasma gas of the second plasma process comprises oxygen.

4. The method of claim 1, wherein a process time of the first plasma process is greater than a process time of the second plasma process.

5. The method of claim 1, wherein forming the spacer layer is performed such that a thickness of the spacer layer is greater than a thickness of the second material layer.

6. The method of claim 1, further comprising:
forming a patterned mask over the conductive contact, wherein etching the second dielectric layer is performed by using the patterned mask as an etch mask to form the recess.

7. The method of claim 6, wherein forming the spacer layer is performed such that the spacer layer has a sidewall along a sidewall of the patterned mask.

8. The method of claim 7, wherein forming the spacer layer is performed such that the sidewall of the spacer layer is in contact with a top surface of the spacer layer on the second dielectric layer.

9. The method of claim 1, further comprising:
performing an etching process to partially remove the spacer layer.

10. The method of claim 9, wherein the etching process is performed such that the spacer layer in the recess is remained and the second material layer is exposed.

11. The method of claim 9, wherein the etching process is performed using an acid etchant.

\* \* \* \* \*